United States Patent [19]

Nelson

[11] Patent Number: 5,126,657
[45] Date of Patent: Jun. 30, 1992

[54] APPARATUS FOR TESTING COMPUTER CHIPS IN THE CHIPS NORMAL OPERATING ENVIRONMENT

[75] Inventor: Dean H. Nelson, Milpitas, Calif.

[73] Assignee: Sun Microsystems, Inc., Mountain View, Calif.

[21] Appl. No.: 608,356

[22] Filed: Nov. 2, 1990

[51] Int. Cl.$^5$ .................. G01R 31/02; G01R 31/26
[52] U.S. Cl. .................. 324/158 F; 324/158 P; 439/68; 439/620
[58] Field of Search .............. 324/158 P, 158 F, 72.5, 324/73.1; 439/68, 69, 70, 482, 620, 921; 381/15.1, 25.1; 437/8; 361/399, 400, 401

[56] References Cited

U.S. PATENT DOCUMENTS

| | | | |
|---|---|---|---|
| 4,352,061 | 9/1982 | Matrone | 324/158 P |
| 4,835,464 | 5/1989 | Jones et al. | 324/158 P |
| 4,853,626 | 8/1989 | Resler | 324/158 F |
| 4,862,076 | 8/1989 | Renner et al. | 324/158 F |
| 4,924,179 | 5/1990 | Sherman | 324/158 F |
| 4,962,356 | 10/1990 | Eberlein et al. | 324/158 P |

FOREIGN PATENT DOCUMENTS

| | | | |
|---|---|---|---|
| 0018664 | 1/1984 | Japan | 324/158 F |
| 0006155 | 4/1984 | Japan | 324/158 F |
| 0165969 | 6/1989 | Japan | 324/158 F |

*Primary Examiner*—Vinh Nguyen
*Attorney, Agent, or Firm*—Blakely Sokoloff Taylor & Zafman

[57] ABSTRACT

An apparatus for testing computer chips and their assopciated system in their normal operating environment is disclosed. The elements of the apparatus including the receiving elements, the mounting elements and the test equipment coupling elements are disposed on a circuit board in a manner allowing the apparatus mounted with the removed computer chips, to be mounted to a host board in a manner, thereby enabling the comptuer chips to be tested without having to tilt or otherwise move the host board. As a result, testing of the computer chips is accomplished in a more efficient and cost effective manner.

9 Claims, 5 Drawing Sheets

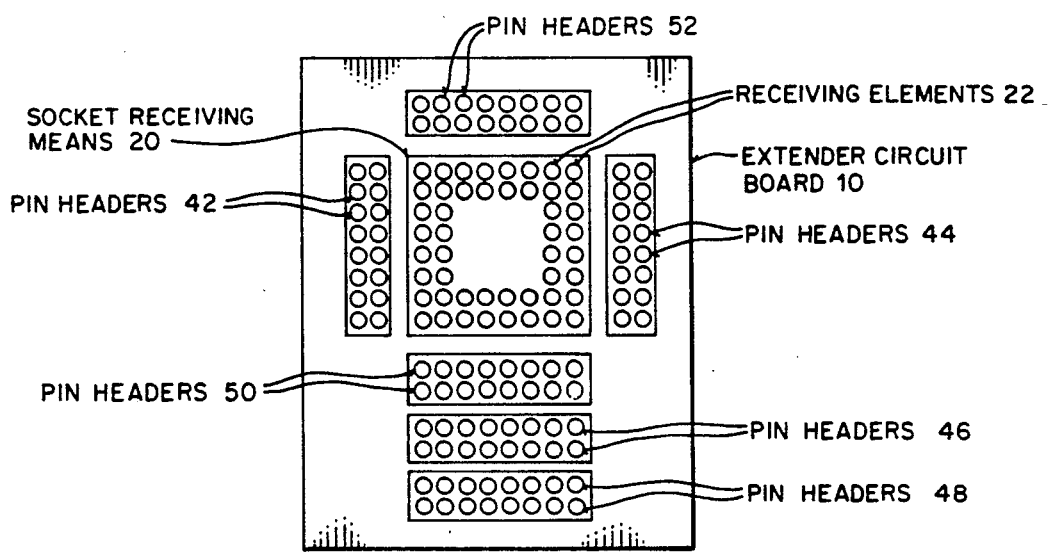
FIG_1A
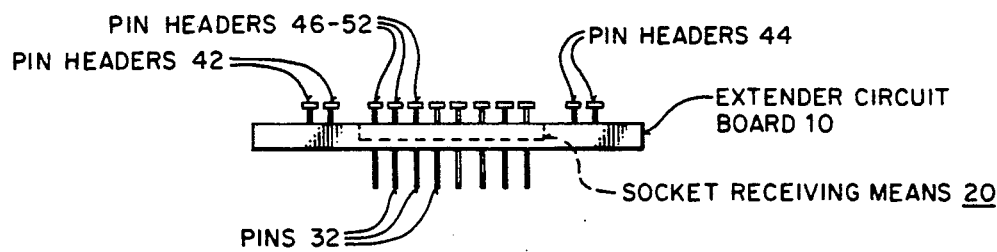
FIG_1B
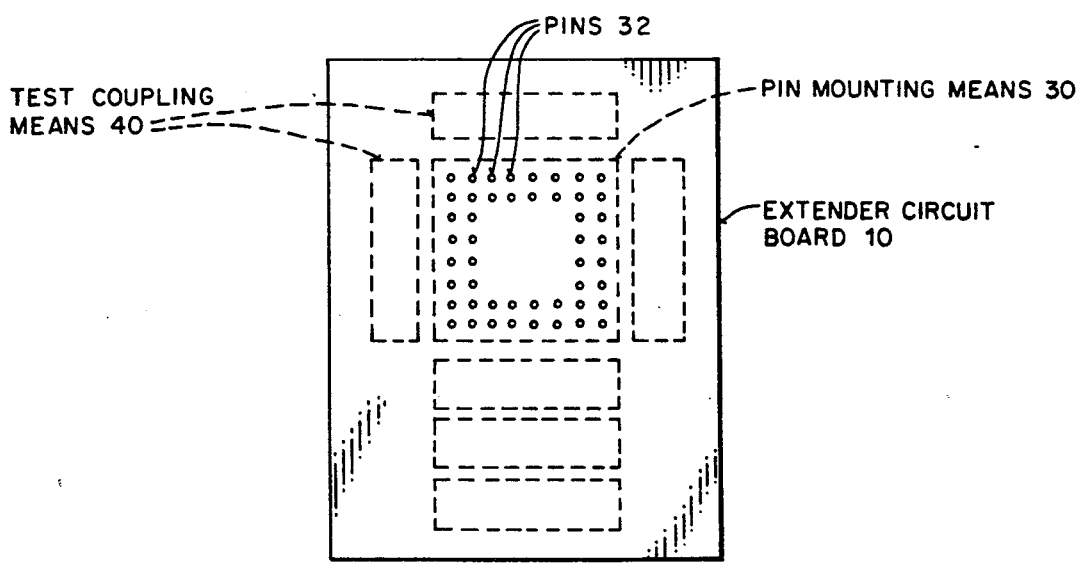
FIG_1C

FIG_2
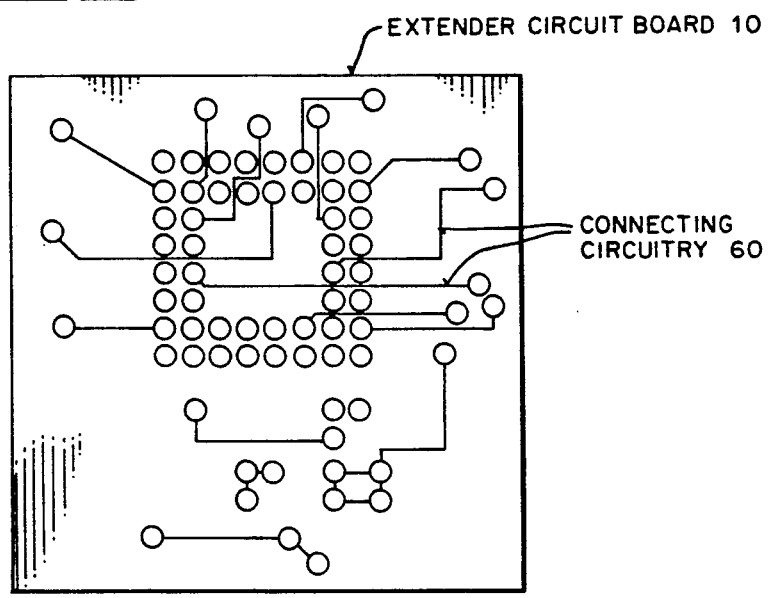
FIG_3
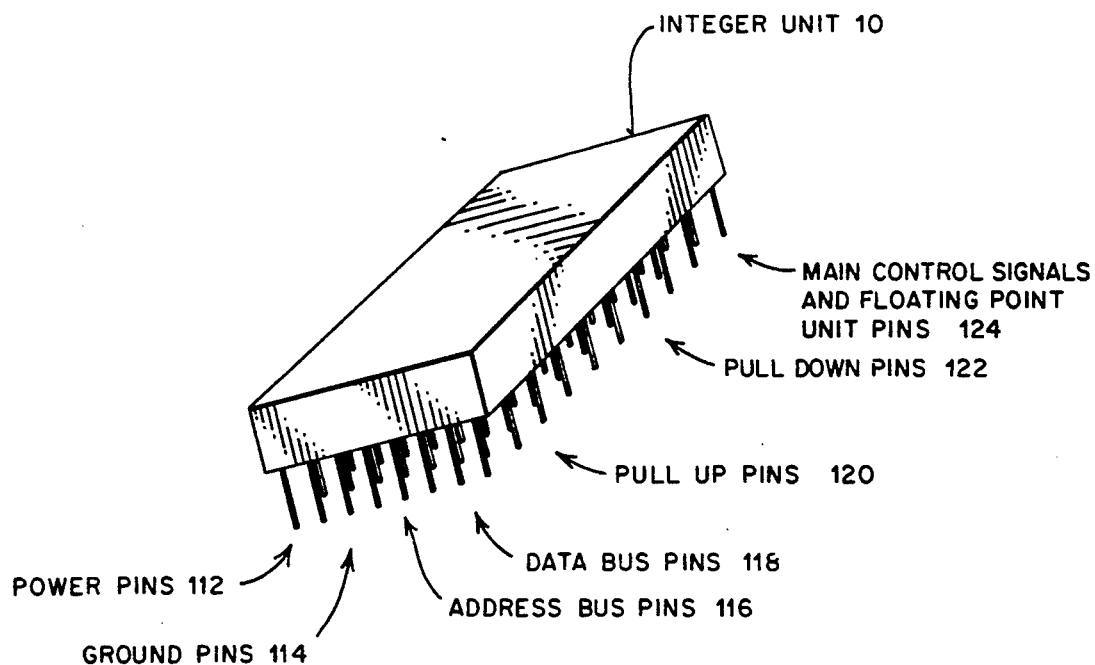

FIG _ 4A
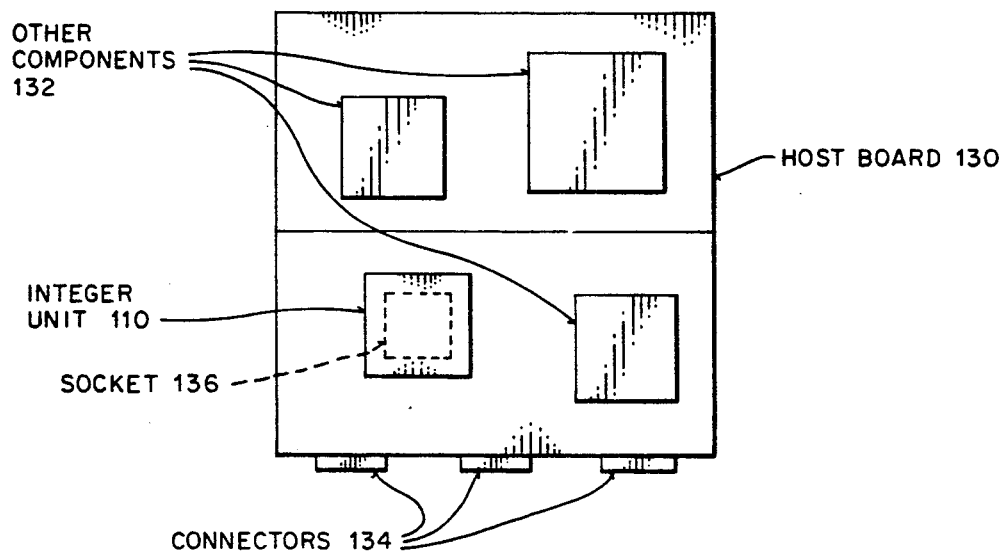
FIG _ 4B
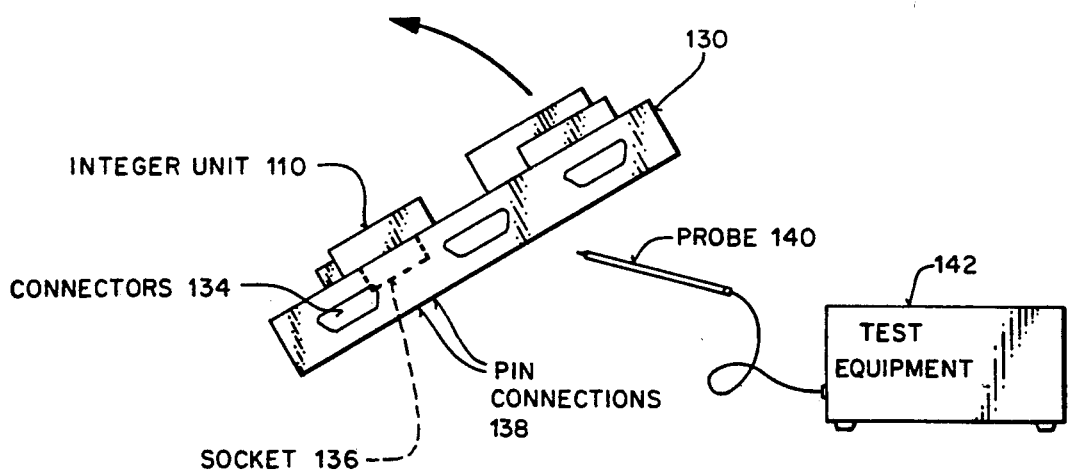

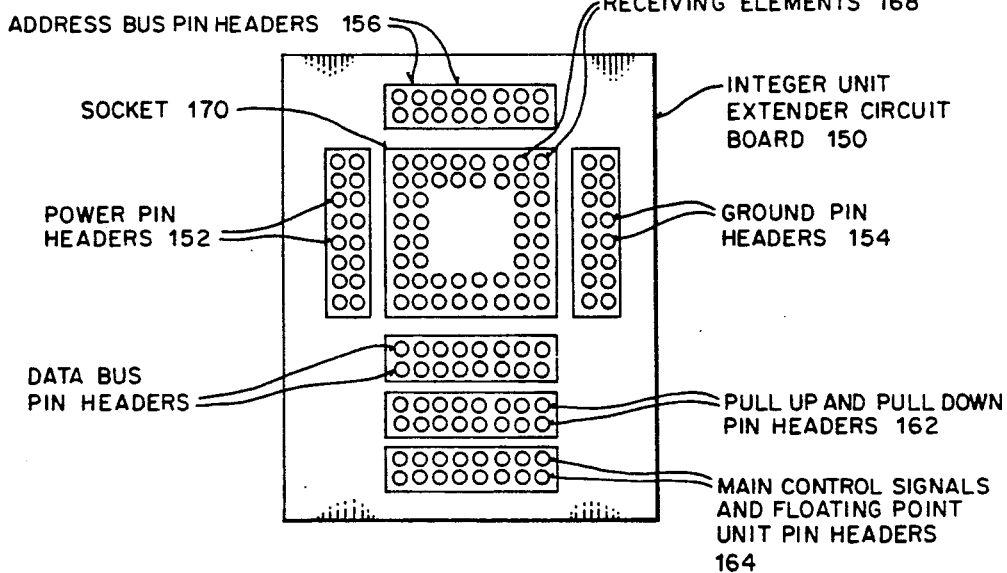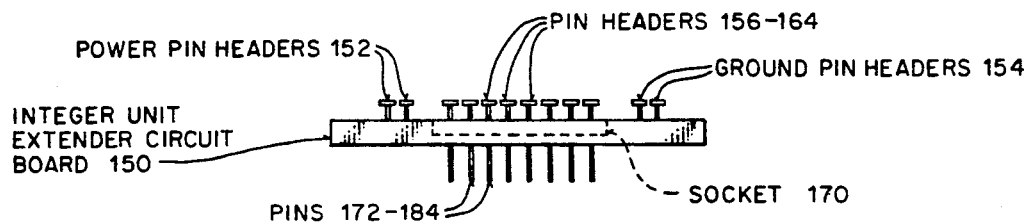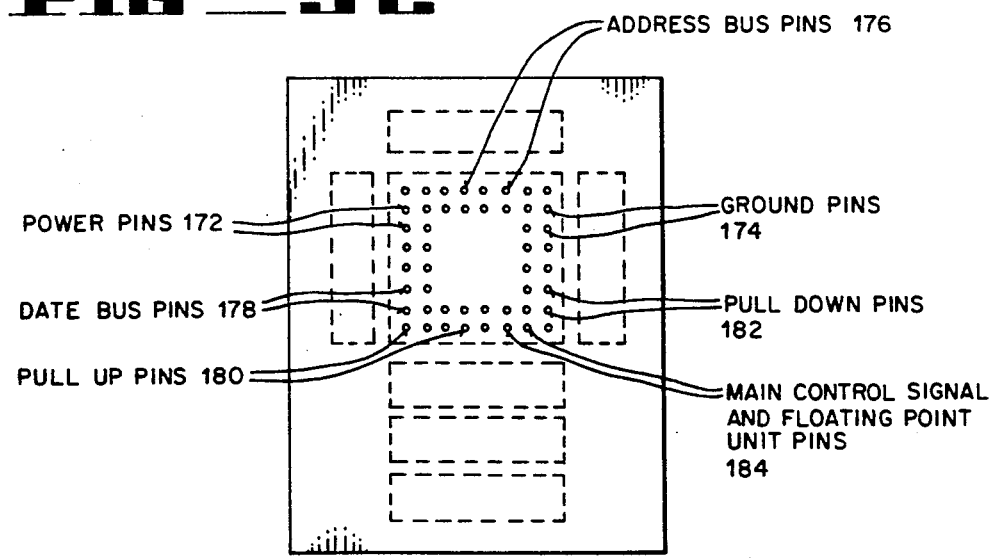

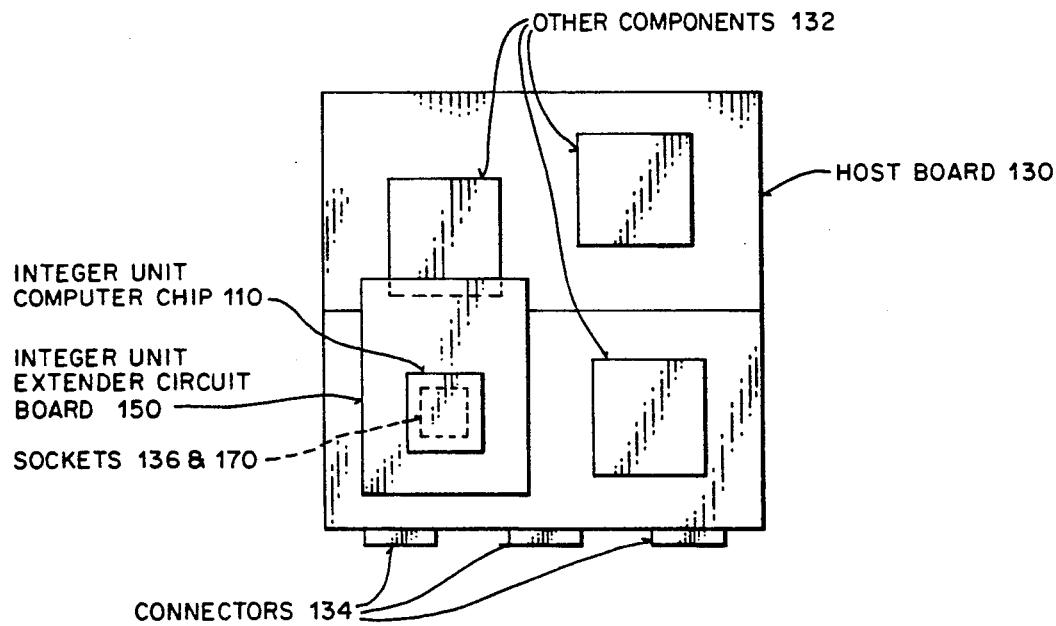
FIG_6A
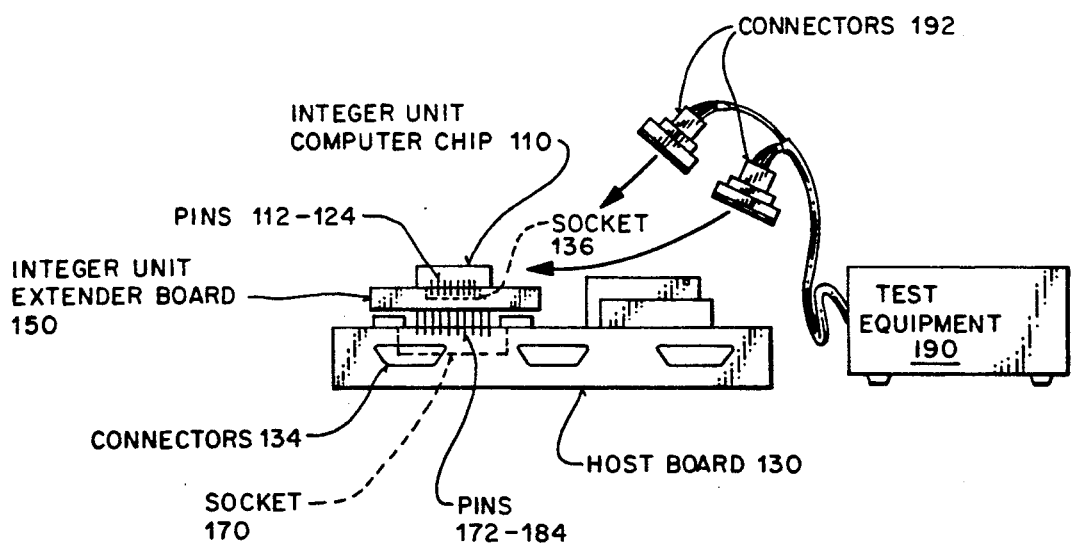
FIG_6B

APPARATUS FOR TESTING COMPUTER CHIPS IN THE CHIPS NORMAL OPERATING ENVIRONMENT

BACKGROUND OF THE INVENTION

1. Field of the Invention

The present invention relates to testing of computer integrated circuits ("chips"). More particularly, the present invention relates to an apparatus for reducing the cost and improving the efficiency of testing computer chips and their associated system, in the computer chips normal operating environment.

2. History of the Prior Art

The efficient design and implementation of complex computer chips in increasingly sophisticated computer systems often requires that the computer chips be tested as they operate in conjunction with the other computer chips which comprise the system. Accurate off-board testing of many computer chips is very difficult because testing a chip independently from its overall system invariably ignores a vast array of test signal combinations that the chip will encounter during actual operation on the host board. Moreover, each chip must remain mounted on the host board if operation of the entire system is to be properly analyzed.

Systems designers long ago recognized the inefficiencies and inevitable pitfalls associated with off-board testing of computer chips. As a result, designers began testing computer chips and complete systems operation as the computer chips functioned in their normal operating environment with the computer chips mounted on the host board. This testing method, however, has a number of inherent problems and disadvantages.

These inherent problems and disadvantages arose primarily because the pins on a chip are not easily accessible to test equipment when the chip is mounted on a host board. Prior attempts at accessing the pins on a computer chip as it operates on a host board have been accomplished in a variety of ways. The most popular approach to testing a chip as it operates in conjunction with other chips on a host board has been to physically turn the entire host board on its side and then use a probe to contact the underside connections of the pins on the chip. By doing so, the designer can use an oscilloscope to view the signals appearing on the tested pin.

The first problem with testing chips with a probe is that one must inconveniently tilt the entire board upward in order to see the underside pin connections. Once the board has been tilted, the top of the chip is no longer visible, i.e. one cannot see both sides of the chip at the same time. Since pin labeling schemes typically only label the pins with reference to a top view of the chip, it is difficult for the designer to identify one pin from the next when only viewing the underside of the chip. This predicament forces the designer to constantly tilt the board back and forth in order to coordinate the pin arrangement from the top of the chip with its arrangement from the bottom to be sure he is placing the probe on the correct underside pin connection. This testing method becomes increasingly difficult as the number of pins on the tested chip increases. For example, it is not uncommon for some computer chips to have over one hundred pins. Realistically, whenever a chip has more than about ten pins, it becomes difficult for the designer to keep track of all of the pins because they are all spaced very close together and there can be many different pins performing an equally large number of different functions. Moreover, many multi-pinned chips create an additional problem for the designer because all of the pins accessible from the underside of the board may not be visible from the top side of the chip. The ceramic package of the chip itself often hides a number of pins positioned directly under it. Hence, the designer must try to compare the top view of a pin diagram with the underside pin configuration of the chip as it sits in the host board, a confusing and timely chore to say the least.

A second chip testing problem arises when the designer is forced to turn the host board on its side in order to access the electrical connections to the pins on a chip. The described requirement of constantly tilting the host board back and forth creates harmful stress on the board itself. Stress weakens the board and the metal traces that form the electrical connections between the pins on all of the chips mounted on the host board. Too much stress on the board can cause the trace connections to break. A broken trace connection creates an open circuit between two pins and, consequently, renders the entire board useless. Thus, not only does tilting the board result in inefficient, cumbersome testing, but it can also result in the costly requirement of replacing the entire host board and further delay testing of the chip and the system.

Systems designers who test computer systems and the computer chips which comprise those systems also encounter testing problems associated with the probe that is used to sense signal levels on the pin of a board-mounted computer chip. These problems principally include the occurrence of unpredictable damaging arcs of electrical charge which emanates from the probe and falls on nearby trace connection lines. An arc from the probe to a trace connection line can cause the trace to burn out. A burnt out trace line results in a break in the electrical connection that it forms between pins mounted in the host board. Arcs commonly occur when a probe is used to test a high voltage signal on a pin. As the testing needle of the probe moves too close to one of the trace lines carrying a low voltage signal, the high voltage charge on the probe can arc over to the trace line and cause the trace to melt, thereby breaking the trace connection. Not unlike stress damage, arc damage to traces on the host board can also render the host board useless. Again, not only does this require the costly replacement of the host board, but it further delays the testing of the computer chips and the associated computer system.

SUMMARY OF THE INVENTION

It is therefore an object of the present invention to improve the efficiency and reduce the cost of testing computer chips.

It is a further object of the present invention to provide for testing of computer chips and their associated system in the computer chips normal operating environment.

It is also an object of the present invention to improve access to the operating signals of the computer chips, reduce stress damages and arc damages to the host board when testing computer chips in their normal operating environment.

The objects are realized by providing the apparatus of the present invention for the computers chips to be tested. The apparatus comprises receiving means having a plurality of receiving elements, mounting means having a plurality of mounting elements, test coupling means having a plurality of test coupling elements and circuitry means for electrically connecting the receiving elements, the mounting elements and the test coupling elements individually.

The receiving means of the apparatus mates with the mounting means of the computer chips and the mounting means of the apparatus mates with the receiving means of the host board. Furthermore, the receiving means of the apparatus, the mounting means of the apparatus and the test coupling means are disposed in a manner such that, the apparatus may be mounted to the host board replacing the computer chips to be tested. The removed computer chips are in turn mounted to the apparatus, thereby allowing the computer chips to be tested without having to tilt or otherwise move the host board.

The preferred embodiment of the apparatus comprises a socket receiving means having a plurality of receiving elements, a pin mounting means having a plurality of pins and test coupling means having a plurality of pin headers. The socket receiving means of the apparatus, the pins mounting means of the apparatus and the test coupling means are disposed on a circuit board. The pins of the pin mounting means of the apparatus and the pin headers are numerically marked corresponding to the pins of the pin mounting means of the computer chip.

BRIEF DESCRIPTION OF THE DRAWINGS

The objects, features and advantages of the present invention will be apparent from the following detailed description of one of the embodiments of the invention with references to the following drawings in which:

FIGS. 1a-1c are the top, side and bottom views of the extender circuit board of the present invention.

FIG. 2 is a top view of one of the layer of the connecting circuitry for the extender circuit board of the present invention.

FIG. 3 is a perspective view of an exemplary integer unit computer chip to be tested.

FIGS. 4a-4b is the top and side views of a host board with the integer unit computer chip mounted. FIG. 4b also illustrates the positioning of the host board, under the prior art, to facilitate testing of the integer unit computer chip.

FIGS. 5a-5c are the top, side and bottom views of the extender circuit board of the present invention adapted for testing an integer unit computer chip.

FIGS. 6a-6b are the top and side views of a host board, the integer unit computer chip and the integer unit extender circuit board mounted together. FIG. 6b also illustrates the positioning of the host board when the integer unit computer chip is tested using the extender circuit board of the present invention.

DETAILED DESCRIPTION OF THE INVENTION

An apparatus for testing computer chips in the chip's normal operating environment is disclosed. For ease of understanding, the apparatus of the present invention is described with the preferred embodiment of an extender circuit board testing an integer unit computer chip having pin mounting means comprising a plurality of pins. The integer unit computer chip is mounted to a host board by mating the pins with the receiving elements of the socket receiving means of the host board. Those who are skilled in the art will appreciate that the present invention is not limited to testing one integer unit computer chip only. The extender circuit board described may be configured to test a variety of computer chips having a variety of mounting means, one at a time or simultaneously.

Referring now to FIGS. 1a-1c which show the top view, the side view and the bottom view of the preferred embodiment of the extender circuit board 10 of the present invention. The extender circuit board 10 comprises a socket receiving means 20 having a plurality of receiving elements 22, a pin mounting means 30 having a plurality of pins 32, and test mounting means 40 having a plurality of pin headers 42-52.

The socket receiving means 20 receives the computer chip to be tested onto the extender circuit board 10. The receiving elements 22 mates with the pins of the pin mounting means of the computer chip to be tested. The socket receiving means 20 is disposed at a location on the extender circuit board 10 such that, the computer chip to be tested may be mounted to the extender circuit board 10 easily. Preferably, the socket receiving means 20 is disposed at the center of the 'top' surface of the extender circuit board 10.

The pin mounting means 30 mounts the extender circuit board 10 to the host board of the computer chip to be tested, after the computer chip is removed from the host board and mounted to the extender circuit board 10. The pins 32 mate with the socket receiving elements of the socket receiving means of the host board. The pin mounting means 30 is disposed at a location on the extender circuit board 10 such that the extender circuit board 10, having the computer chip mounted on it, may be mounted to the host board in a manner enabling the computer chip to be tested without having to tilt or otherwise move the host board. Preferably, the pin mounting means 30 is disposed on the opposite side of the socket receiving means 20. Furthermore, the pins 32 are sufficiently long to enable the extender circuit board 10 to be mounted to the host board, occupying a plane substantially parallel to the host board. In addition, the pins 32 are numerically marked corresponding to the pins of the pin mounting means of the computer chip to be tested.

The test coupling means 40 enable test equipments to be coupled to the extender circuit board 10. The pin headers 42-52 serve as an extension of the pins of the computer chip and they perform a dual function. The pin headers 42-52 may be used to supply the computer chip with a variety of signals or they may be used to monitor the signals appearing on any of the pins of the computer chip as the computer chip operates.

The pin headers 42-52 mate with the connectors of the test equipments. The test coupling means 40 are disposed at locations on the extender circuit board 10 such that, the pin headers may be accessed without having to tilt or otherwise move the host board, after the extender circuit board 10 having the computer chip mounted on it, is in turn mounted to the host board. Preferably, the test coupling means 40 are disposed around the socket receiving means 20 on the same side as the socket receiving means 20. In addition, the pin headers 42-52 are numerically marked corresponding to the pins of the pin mounting means of the computer chip to be tested.

The receiving elements 22 of the socket receiving means 20, the pins 32 of the pin mounting means 30 and the pin headers 42-52 of the test coupling means 40 are electrically connected to each other on a one to one basis. That is, one receiving element 22 is coupled to one pin 32 and one pin header 42-52. FIG. 2 illustrates one layer of the connecting circuitry 60. It will be understood that multiple layers of connecting circuitry 60 is required to enable the receiving elements 22, the pins 32 and the pin headers 42-52 to be electrically connected to each other on a one to one basis.

While the preferred embodiment includes one socket receiving means 20 for receiving one computer chip, it should be understood that the extender circuit board 10 of the present invention is not limited to testing one computer only. The extender circuit board 10 may include a plurality of socket receiving means 20 for a plurality of computer chips to be tested, provided equal number of pin mounting means 30 are included and the pin mounting means 30 are disposed at locations on the extender circuit board 10 as discussed above. Furthermore, it would be preferable if a corresponding number of properly located test coupling means 40 is also provided.

Referring now to FIGS. 3-6 which illustrate applying the extender circuit board of the present invention to the testing of an exemplary integer unit computer chip. FIG. 3 shows a perspective view of an exemplary integer unit computer chip 110 to be tested. The integer unit computer chip 110 comprises a plurality of power pins 112, a plurality of ground pins 114, a plurality of address bus pins 116, a plurality of data bus pins 118, a plurality of pull up pins 120, a plurality of pull down pins 122, a plurality of main control signals and floating point unit pins 124. The precise locations of these pins 112-124 are not important for understanding how the extender circuit board of the present invention may be used.

FIG. 4a shows the top view of a host board 130 where the integer unit computer chip 110 is normally mounted and operate. The pins 112-124 of the integer unit computer chip 110 mate with the receiving elements of the socket 136 of the host board 130. From the top view, the socket 136 is underneath the integer unit computer chip 110 to be tested, as indicated by the dotted line representation. Beside the integer unit computer chip 110, the host board 130 also includes a plurality of other components 132 and a plurality of connectors 134.

FIG. 4b shows the front view of the host board 130 and illustrates how under the prior art, in order to facilitate testing of the integer unit computer chip 110, the host board 130 is tilted on its side to allow access to the underside of the pin connections 138 of the integer unit computer chip 110, by the probe 140 attached to the test equipment 142.

FIGS. 5a-5c show the top view, the side view and the bottom view of an extender circuit board of the present invention 150 adapted for testing the integer unit computer chip 110. The integer unit extender circuit board 150 comprises a socket 170 having a plurality of receiving element 168, a plurality of power pin headers 152, a plurality of ground pin headers 154, a plurality of address bus pin headers 156, a plurality of data bus pin headers 158, a plurality of pull up pin headers 160, a plurality of pull down pin headers 162, a plurality of main control signals and floating point unit pin headers 164, a plurality of power pins 172, a plurality of ground pins 174, a plurality of address bus pins 176, a plurality of data bus pins 178, a plurality of pull up pins 180, a plurality of pull down pins 182, and a plurality of main control signals and floating point unit pins 184.

The socket 170 is disposed at the 'center' of the top surface of the integer unit extender circuit board 150, with the pin headers 152-156 disposed around it. The pins 172-184 are disposed on the bottom side of the integer unit extender circuit board 150. The pins 172-184 are sufficiently long to allow the integer unit extender circuit board 150 to be mounted to the host board 130, occupying a plane substantially parallel to the host board 130. The receiving elements 168 of the socket 170, the pins 172-184 and the pin headers 152-156 are electrically connected to one another on a one to one basis. Furthermore, the pin headers 152-64 and the pins 172-84 are numerically marked corresponding to the pins 112-24 of the integer unit computer chip 110.

FIGS. 6a-6b show the top view and the side view of the integer unit computer chip 110, the integer unit extender board 150 and the host board 130 mounted together. The integer unit computer chip 110 is removed from the host board 130 and mounted to the integer unit extender circuit board 150. The pins 112-124 mate with the receiving elements 168 of the socket 170. The integer unit extender circuit board 150 having the integer unit computer chip 110 mounted on it, is in turn mounted to the host board 130. The pins 172-184 mate with the receiving elements of the socket 136 of the host board 130. The integer unit extender circuit board 150 occupies a plane substantially parallel to the host board 130. One or more of the other components 132 may be totally or partially underneath the integer unit extender circuit board 150.

FIG. 6b further illustrates how the testing of the integer unit computer chip 110 may be accomplished. A plurality of connectors 192 from test equipment 190 may be connected to the pin headers 152-64 of the extender board 150. Signals may be supplied to the integer unit computer chip 110 by the test equipment 190. Likewise, signals appearing on any of the pins 112-24, as the integer unit computer chip 110 operates, may be monitored by the test equipment 190. It will be understood that ribbon cables with attachments adapted to fit over the pin headers 152-162 may be used for the connectors 192. The use of ribbon cables will enable simultaneous monitoring of multiple input and output signals. As a result, testing of the integer unit computer chip 110 may be accomplished in a more efficient manner.

In addition, as illustrated by FIG. 6b, testing of the integer unit computer chip 110 may be accomplished without having to tilt or otherwise move the host board 130. Therefore, less stress damages to the host board 130 will be sustained. Similarly, since the use of a probe to test the integer unit computer chip 110 is no longer needed, less arc damages will be sustained by the host board 130. As a result, testing of the integer unit computer chip 110 may be accomplished in a more cost effective manner.

Beside being used for testing the integer unit computer chip 110, the integer unit extender circuit board 150 may also facilitate testing of the entire system. The system may be debugged using the integer unit extender circuit board 150 by observing a set of signals on the integer unit computer chip 110 while simultaneously observing the anticipated resulting signals in another part of the system. If the first set of signals on the integer unit computer chip 110 is correct and the anticipated set of correct resulting signals on the other part of the system is not observed, then there is a problem in one or more of the components in the electrical path, including the integer unit computer chip 110, between the two testing positions. Those who are skill in the art will recognize that such system debugging is a useful and timesaving technique and made possible only through the use of the extender circuit board of the present invention.

While the invention has been described in terms of a preferred embodiment, those skilled in the art will recognize that the invention can be practiced with modification, alteration and extension within the spirit and scope of the appended claims to test a variety of computer chips and their associated systems, simultaneously or sequentially.

What is claimed is:

1. An integer unit extender circuit board for testing integer units which normally operate mounted on a host board, said integer unit extender circuit board comprising:
   first socket receiving means for physically and electrically connecting an integer unit to said integer unit extender circuit board, after said integer unit is removed from said host board, said first socket receiving means comprising a first plurality of sockets for mating with a first plurality of pins of a first pin mounting means of said integer unit, said first plurality of pins comprising a first plurality of address bus and data bus pins, a first plurality of pull up and pull down pins, and a first plurality of main control signal and floating point unit pins,
   second pin mounting means for physically and electrically connecting said integer unit extender circuit board to said host board, said second pin mounting means comprising a second plurality of corresponding pins to said first plurality of pins for mating with a second plurality of sockets of a second socket receiving means of said host board corresponding to said first plurality of sockets, said second plurality of corresponding pins comprising a second plurality of address bus and bus pins, a second plurality of pull up and pull down pins and a second plurality of main control signal and floating point unit pins, said second plurality of sockets mating with said first plurality of pins before said integer unit was removed from said host board;
   pin header means for physically and electrically coupling said integer unit extender circuit board to at least one test equipment, said pin header means comprising a plurality of corresponding pin headers to said first and second plurality of pins for mating with coupling elements of said test equipment, said corresponding pin headers comprising a plurality of address bus and data bus pin headers, a plurality of pull up and pull down pin headers, and a plurality of main control signal and floating point unit pin headers; and
   circuitry means for electrically connecting said first plurality of sockets, said second plurality of pins, and said plurality of pin headers to each other on a one to one basis;
   said first socket receiving means, said second pin mounting means and said pin header means are disposed in a manner allowing said integer unit extender circuit board, mounted with said integer unit, to be mounted to said host board in a manner that enables said integer unit to be tested with said host board without having to tilt or otherwise move said host board.

2. The integer unit extender circuit board as set forth in claim 1, wherein said first socket receiving means, said second pin mounting means and said pin header means are disposed on said integer unit extender circuit board in a manner allowing said integer unit extender circuit board mounted with said integer unit, to be mounted to said host board in a manner such that said integer unit extender circuit board occupies a plane substantially parallel to said host board.

3. The integer unit extender circuit board as set forth in claim 2, wherein said first socket receiving means and said second pin mounting means are disposed on the opposite sides of said integer unit extender circuit board.

4. The integer unit extender circuit board as set forth in claim 3 wherein said first socket receiving means and said pin header means are disposed on the same side of said integer unit extender circuit board.

5. The integer unit extender circuit board as set forth in claim 1, wherein said second plurality of pins of said second pin mounting means are symbolically labeled to identify their corresponding pins of said first plurality of pins.

6. The integer unit extender circuit board as set forth in claim 5, wherein said second plurality of pins of said second pin mounting means are numerically labeled to identify their corresponding pins of said first plurality of pins.

7. The integer unit extender circuit board as set forth in claim 1, wherein said pin headers are symbolically labeled to identify their corresponding pins of said first and second plurality of pins.

8. The integer unit extender circuit board as set forth in claim 7, wherein said pin headers are numerically labeled to identify their corresponding pins of said first and second plurality of pins.

9. The integer unit extender circuit board as set forth in claim 1, wherein,
   said first plurality of pins of said first pin mounting means of said integer unit further comprise a first plurality of power pins, a first plurality of ground pins and a first plurality of control pins,
   said second plurality of corresponding pins further comprise a second plurality of power pins, a second plurality of ground pins and a second plurality of control pins;
   said plurality of corresponding pin headers further comprise a plurality of power pin headers, a plurality of ground pin headers and a plurality of control pin headers.

* * * * *